United States Patent
Morozumi et al.

(10) Patent No.: US 11,535,034 B2
(45) Date of Patent: Dec. 27, 2022

(54) PIEZOELECTRIC ELEMENT AND LIQUID EJECTING HEAD INCLUDING PIEZOELECTRIC LAYER HAVING IMPROVED LATTICE RATIO

(71) Applicant: Seiko Epson Corporation, Tokyo (JP)

(72) Inventors: Koichi Morozumi, Shiojiri (JP); Hiromu Miyazawa, Azumino (JP); Hiroshi Kato, Okaya (JP); Hiroshi Ito, Suwa (JP)

(73) Assignee: SEIKO EPSON CORPORATION

( * ) Notice: Subject to any disclaimer, the term of this patent is extended or adjusted under 35 U.S.C. 154(b) by 1056 days.

(21) Appl. No.: 16/135,352

(22) Filed: Sep. 19, 2018

(65) Prior Publication Data

US 2019/0084306 A1    Mar. 21, 2019

(30) Foreign Application Priority Data

Sep. 20, 2017 (JP) .............................. JP2017-180273

(51) Int. Cl.
  *B41J 2/14*   (2006.01)
  *H01L 41/047* (2006.01)
  (Continued)

(52) U.S. Cl.
  CPC ...... *B41J 2/14233* (2013.01); *H01L 41/0474* (2013.01); *H01L 41/0478* (2013.01); *H01L 41/0805* (2013.01); *H01L 41/0973* (2013.01); *H01L 41/1876* (2013.01); *H01L 41/311* (2013.01); *B41J 2202/03* (2013.01); *H01L 41/29* (2013.01); *H01L 41/293* (2013.01); *H01L 41/318* (2013.01)

(58) Field of Classification Search
  CPC ..... H01L 41/29; H01L 41/293; H01L 41/311; H01L 41/318; H01L 41/0474; H01L 41/0478; H01L 41/0805; H01L 41/0973; H01L 41/1876; B41J 2202/03; B41J 2/14233
  USPC ........................................................ 310/328
  See application file for complete search history.

(56) References Cited

U.S. PATENT DOCUMENTS

2003/0173871 A1* 9/2003 Kanno ................ H01L 41/0973
                                                      310/358
2008/0211881 A1* 9/2008 Ifuku .................. H01L 41/1875
                                                         347/70
(Continued)

FOREIGN PATENT DOCUMENTS

JP    2003-133604 A    5/2003
JP    2007-142261 A    6/2007
(Continued)

*Primary Examiner* — Emily P Pham
*Assistant Examiner* — Monica Mata
(74) *Attorney, Agent, or Firm* — Harness, Dickey & Pierce, P.L.C.

(57) ABSTRACT

A piezoelectric element including a piezoelectric layer having a perovskite structure including lead, zirconium, and titanium, and an electrode provided on the piezoelectric layer is provided. In the piezoelectric layer, in a range of 50 nm or smaller from an interface between the piezoelectric layer and the electrode in a thickness direction, a ratio c/a of a lattice spacing a in a direction perpendicular to the thickness direction and a lattice spacing c in the thickness direction satisfies $0.986 \leq c/a \leq 1.014$.

12 Claims, 9 Drawing Sheets

| | SECOND ELECTRODE | $(c/a)_{MAX}$ | $\varepsilon_{yyMAX}$ | $\Delta(\varepsilon_{yyMAX} - \varepsilon_{yyMIN})$ | AMOUNT OF DISPLACEMENT | DIFFERENCE IN AMOUNT OF DISPLACEMENT AFTER USE |
|---|---|---|---|---|---|---|
| EXAMPLE 1 | $IrO_2$ | 1.002 TO 1.008 | 0.96% TO 1.02% | 1.29% TO 1.42% | 1.16 | -1.1% |
| COMPARATIVE EXAMPLE 1 | $IrO_x$ | 1.015 TO 1.016 | 2.06% TO 2.57% | 2.27% TO 2.54% | 1.00 | -2.5% |

(51) Int. Cl.
*H01L 41/187* (2006.01)
*H01L 41/311* (2013.01)
*H01L 41/09* (2006.01)
*H01L 41/08* (2006.01)
H01L 41/293 (2013.01)
H01L 41/318 (2013.01)
H01L 41/29 (2013.01)

(56) References Cited

U.S. PATENT DOCUMENTS

| | | | |
|---|---|---|---|
| 2010/0225710 A1* | 9/2010 | Iwashita | H01L 41/081 347/71 |
| 2014/0267510 A1 | 9/2014 | Furuya | |
| 2016/0096368 A1* | 4/2016 | Yazaki | B41J 2/1632 347/70 |
| 2016/0236470 A1* | 8/2016 | Mizukami | B41J 2/1629 |

FOREIGN PATENT DOCUMENTS

| | | |
|---|---|---|
| JP | 2011-233817 A | 11/2011 |
| JP | 2014-176984 A | 9/2014 |
| WO | 2008/117700 A1 | 10/2008 |

\* cited by examiner

FIG. 11

| | SECOND ELECTRODE | $(c/a)_{MAX}$ | $\varepsilon_{yyMAX}$ | $\Delta(\varepsilon_{yyMAX}-\varepsilon_{yyMIN})$ | AMOUNT OF DISPLACEMENT | DIFFERENCE IN AMOUNT OF DISPLACEMENT AFTER USE |
|---|---|---|---|---|---|---|
| EXAMPLE 1 | $IrO_2$ | 1.002 TO 1.008 | 0.96% TO 1.02% | 1.29% TO 1.42% | 1.16 | −1.1% |
| COMPARATIVE EXAMPLE 1 | $IrO_x$ | 1.015 TO 1.016 | 2.06% TO 2.57% | 2.27% TO 2.54% | 1.00 | −2.5% |

PIEZOELECTRIC ELEMENT AND LIQUID EJECTING HEAD INCLUDING PIEZOELECTRIC LAYER HAVING IMPROVED LATTICE RATIO

This application claims priority under 35 U.S.C. § 119 to Japanese Patent Application No. 2017-180273 filed on Sep. 20, 2017, the entire disclosure of which is expressly incorporated by reference herein.

BACKGROUND

1. Technical Field

The present invention relates to a piezoelectric element and a liquid ejecting head.

2. Related Art

A piezoelectric element typically includes a piezoelectric layer having an electromechanical conversion characteristic and two electrodes that sandwich the piezoelectric layer. As a device including such a piezoelectric element as a drive source, a liquid ejecting head typically used for an ink jet recording head is known.

For example, JP-A-2011-233817 discloses that the piezoelectric characteristic of a potassium sodium niobate (KNN)-based piezoelectric thin film is improved by setting a crystal lattice distortion amount c/a that is a ratio of an in-plane lattice spacing a of the piezoelectric thin film and a lattice spacing c in a normal direction, which is an out-of-plane direction, of the piezoelectric thin film 0.2% or smaller.

Lead zirconate titanate (PZT) has a high piezoelectric constant, and is preferably used for a piezoelectric layer of a piezoelectric element. Although JP-A-2011-233817 discloses a relationship between the crystal lattice distortion amount c/a (ratio c/a) and the piezoelectric characteristic of a KNN system, there is no guarantee that such a relationship also holds when a different material is used for the piezoelectric layer. Therefore, the piezoelectric characteristic will be not necessarily improved if the ratio c/a defined in the KNN system is applied to PZT.

Further, it has been revealed that the ratio c/a of a piezoelectric layer formed of PZT greatly varies in the thickness direction. It is considered that, in the case of attempting to improve the piezoelectric characteristic of PZT by controlling the ratio c/a, not only the value of the ratio c/a but also the position in the thickness direction is also important.

SUMMARY

One of advantages according to some aspects of the invention is to provide a piezoelectric element having a good piezoelectric characteristic. In addition, one of advantages according to some aspects of the invention is to provide a liquid ejecting head including the piezoelectric element mentioned above.

The invention is made to solve at least part of the problems described above, and can be implemented as following embodiments.

According to an aspect of the invention, a piezoelectric element includes a piezoelectric layer having a perovskite structure including lead, zirconium, and titanium, and an electrode provided on the piezoelectric layer is provided. In the piezoelectric layer, in a range of 50 nm or smaller from an interface between the piezoelectric layer and the electrode in a thickness direction, a ratio c/a of a lattice spacing a in a direction perpendicular to the thickness direction and a lattice spacing c in the thickness direction satisfies $0.986 \leq c/a \leq 1.014$.

In such a piezoelectric element, as will be described in "Examples" that will be described later, for example, the amount of displacement of a diaphragm can be increased, and thus a good piezoelectric characteristic can be achieved.

In the piezoelectric layer of the piezoelectric element according to another aspect of the invention, in a range of 230 nm or smaller from the interface between the piezoelectric layer and the electrode in the thickness direction, the ratio c/a may satisfy $0.986 \leq c/a \leq 1.014$.

Such a piezoelectric element has a good piezoelectric characteristic more certainly.

In the piezoelectric layer of the piezoelectric element according to another aspect of the invention, in the range of 50 nm or smaller from the interface between the piezoelectric layer and the electrode in the thickness direction, distortion of the lattice spacing c in an extending direction may be 2.05% or lower.

Such a piezoelectric element has a good piezoelectric characteristic more certainly.

In the piezoelectric layer of the piezoelectric element according to another aspect of the invention, in the range of 230 nm or smaller from the interface between the piezoelectric layer and the electrode in the thickness direction, difference between a maximum value of distortion of the lattice spacing c in an extending direction and a minimum value of distortion of the lattice spacing c in a contraction direction may be 2.26% or smaller.

Such a piezoelectric element has a good piezoelectric characteristic more certainly.

In the piezoelectric element according to another aspect of the invention, the electrode may include an iridium oxide layer provided on the piezoelectric layer and a titanium oxide layer on the iridium oxide layer.

In such a piezoelectric element, occurrence of oxygen defect in the piezoelectric layer can be suppressed. In the piezoelectric element according to another aspect of the invention, the electrode may include a strontium ruthenate layer provided on the piezoelectric layer and a platinum layer on the strontium ruthenate layer.

In such a piezoelectric element, occurrence of oxygen defect in the piezoelectric layer can be suppressed.

A liquid ejecting head according to an aspect of the invention includes the piezoelectric element according to the invention.

In such a liquid ejecting head, due to the piezoelectric element according to the invention, for example, the amount of displacement of diaphragm is large.

BRIEF DESCRIPTION OF THE DRAWINGS

The invention will be described with reference to the accompanying drawings, wherein like numbers reference like elements.

FIG. 11 is a table showing experimental results of Example 1 and Comparative Example 1.

DESCRIPTION OF EXEMPLARY EMBODIMENTS

A preferable embodiment of the invention will be described in detail with reference to drawings. To be noted, the embodiment that will be described later should not unreasonably limit the scope of the invention described in claims. In addition, not all elements that will be described below are always required for the invention.

1. PIEZOELECTRIC ELEMENT

1.1. Configuration

Figure 1:
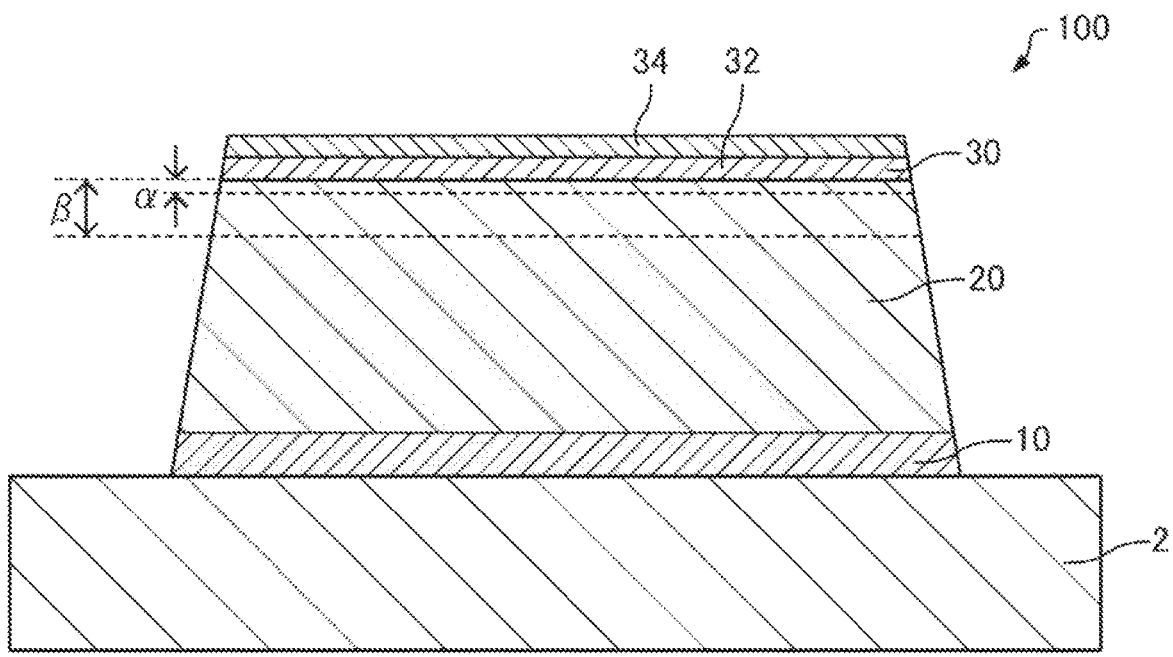
FIG. 1 is a schematic section view of a piezoelectric element according to an embodiment.

First, a piezoelectric element according to the present embodiment will be described with reference to drawings. FIG. 1 is a schematic section view of a piezoelectric element 100 according to the present embodiment.

As illustrated in FIG. 1, the piezoelectric element 100 includes a first electrode 10, a piezoelectric layer 20, a second electrode 30, and a conductive layer 34. The piezoelectric element 100 is formed on, for example, a substrate 2.

For example, the substrate 2 is a flat plate formed from semiconductor, insulator, or the like. The substrate 2 may be a single layer or have a structure in which a plurality of layers are laminated. The inner structure of the substrate 2 is not limited as long as the top surface thereof is flat. For example, the substrate 2 may have a structure in which a space or the like is provided therein.

The substrate 2 may include a diaphragm that is flexible and can be deformed (displaced) by a function of the piezoelectric layer 20. Examples of the diaphragm include a silicon oxide layer, a zirconium oxide layer, and a laminate of these.

The first electrode 10 is provided on the substrate 2. The shape of the first electrode 10 is, for example, a layer shape. The thickness (film thickness) of the first electrode 10 is, for example, 3 nm to 200 nm. Examples of the first electrode 10 include metal layers such as an iridium layer and a platinum layer, layers of conductive oxides of these (for example, an iridium oxide layer), and a strontium ruthenate ($SrRuO_3$: SRO) layer. The first electrode 10 may have a structure in which a plurality of the layers exemplified above are laminated. The first electrode 10 may be oriented in the [111] surface.

The first electrode 10 and the second electrode 30 are a pair of electrodes, and the first electrode 10 is one (lower electrode provided under the piezoelectric layer 20) of the pair of electrodes for applying voltage to the piezoelectric layer 20.

Although not illustrated, a firm contact layer for improving the firmness of contact of the first electrode 10 and the substrate 2 may be provided between the first electrode 10 and the substrate 2. Examples of the firm contact layer include a titanium layer and a titanium oxide layer.

The piezoelectric layer 20 is provided on the first electrode 10. The thickness of the piezoelectric layer 20 is, for example, 100 nm to 3 μm.

The piezoelectric layer 20 has a perovskite structure including lead (Pb), zirconium (Zr), and titanium (Ti). Specifically, the piezoelectric layer 20 is a lead zirconate titanate ($Pb(Zr, Ti)O_3$: PZT) layer. The piezoelectric layer 20 may be oriented in the [100] surface. The piezoelectric layer 20 can be deformed by applying voltage between the first electrode 10 and the second electrode 30.

To be noted, although not illustrated, an orientation control layer for controlling the orientation of the piezoelectric layer 20 may be provided between the piezoelectric layer 20 and the first electrode 10. The orientation control layer is, for example, a titanium layer, a titanium oxide layer, or lead titanate ($PbTiO_3$) layer.

The second electrode 30 is provided on the piezoelectric layer 20. The shape of the second electrode 30 is, for example, a layer shape. The thickness of the second electrode 30 is, for example, 3 nm to 200 nm. The second electrode 30 includes a conductive layer 32 that is, for example, an iridium oxide ($IrO_2$) layer or a strontium ruthenate (SRO) layer. In the illustrated example, the second electrode 30 is constituted by only the conductive layer 32. To be noted, the second electrode 30 may be constituted by the conductive layer 32 and a conductive layer (not illustrated) other than the conductive layer 32.

The first electrode 10 and the second electrode 30 are a pair of electrodes, and the second electrode 30 is the other (upper electrode provided under the piezoelectric layer 20) of the pair of electrodes for applying voltage to the piezoelectric layer 20.

The conductive layer 34 is provided on the second electrode 30. In the illustrated example, the conductive layer 34 is provided on the conductive layer 32. The thickness of the conductive layer 34 is, for example, 3 nm to 200 nm. The conductive layer 34 is, for example, a titanium oxide ($TiO_2$) layer or a platinum layer. For example, the conductive layer 32 is an iridium oxide layer, and the conductive layer 34 is a titanium oxide layer. Alternatively, for example, the conductive layer 32 is an SRO layer, and the conductive layer 34 is a platinum layer.

For example, the piezoelectric element 100 may be applied to a liquid ejecting head or a printer including the liquid ejecting head as a piezoelectric actuator for pressurizing a liquid in a pressure generating chamber, or may be used for other applications such as a piezoelectric sensor (ultrasonic sensor, gyro sensor, or pyroelectric infrared sensor) that detects deformation of the piezoelectric layer as an electric signal.

To be noted, although a side surface of the first electrode 10 and a side surface of the piezoelectric layer 20 are continuous in the example shown in FIG. 1, the width (size in a direction perpendicular to the thickness direction of the substrate 2) of the first electrode 10 may be smaller than the width of the piezoelectric layer 20, and the side surface of the first electrode 10 may be covered by the piezoelectric layer 20. In this case, the second electrode 30 may cover the side surface of the piezoelectric layer 20 and may be provided on the substrate 2.

1.2. Lattice Spacing

In the piezoelectric layer 20 having a perovskite structure, atoms are arranged in a lattice shape spatially repeated in a pattern, and, when the arrangement of atoms is regarded as a plane, spacing between planes is referred to as lattice spacing (crystal spacing). In the invention, the lattice spacing is derived from a four-dimensional scanning transmission electron microscope (4D-STEM) image of a four-dimensional distribution in the real space and the reciprocal space obtained by matching an electron diffraction pattern (nano beam electron diffraction: NBD) with scanning lines. According to this, the influence of local stress per crystal grain of PZT can be detected with high sensitivity.

The lattice shaping c is a lattice spacing (perpendicular-to-the-surface lattice spacing) in the thickness direction (for example, direction from the first electrode 10 to the second electrode 30) of the piezoelectric layer 20. In the illustrated example, the lattice spacing c is a lattice spacing in a normal direction to the top surface of the substrate 2. A lattice shaping a is a lattice spacing (in-plane lattice spacing) in a direction perpendicular to the thickness direction of the piezoelectric layer 20. In the illustrated example, the lattice spacing a is a lattice spacing (in-plane lattice spacing) perpendicular to the normal direction to the top surface of the substrate 2. In the case where the crystal of the piezoelectric layer 20 is not distorted, the lattice spacings a and c are, for example, 4.07 Å.

In the piezoelectric layer 20, in a range α of 50 nm or smaller from an interface (in the illustrated example, the top surface of the piezoelectric layer 20) with the second electrode 30 in the thickness direction, a ratio c/a of the lattice spacing a and the lattice spacing c satisfies the following formula (1), and preferably satisfies the following formula (2).

$$0.986 \leq c/a \leq 1.014 \quad (1)$$

$$0.99 \leq c/a \leq 1.01 \quad (2)$$

Further, in the piezoelectric layer 20, in a range β of 230 nm or smaller from the interface with the second electrode 30 in the thickness direction, the ratio c/a satisfies, for example, the formula (1), and preferably satisfies the formula (2). The ratio c/a has a distribution in the thickness direction of the piezoelectric layer 20, and the value thereof varies depending on the position in the thickness direction of the piezoelectric layer 20. In the range α, the piezoelectric layer 20 satisfies the formula (1) in, for example, all positions in the thickness direction. In the case where the ratio c/a is larger than 1, compressive stress is generated in the piezoelectric layer 20. In the case where the ratio c/a is smaller than 1, tensile stress is generated in the piezoelectric layer 20.

In the piezoelectric layer 20, in the range α, distortion of the lattice spacing c in the extending direction is, for example, 2.05% or smaller, preferably 1.7% or smaller, and more preferably 1.1% or smaller.

In the piezoelectric layer 20, in the range difference between the maximum value of distortion of the lattice spacing c in the extending direction and the minimum value of distortion of the lattice spacing c in the contraction direction is, for example, 2.26% or smaller, preferably 1.8% or smaller, and more preferably 1.5% or smaller.

Here, "distortion of the lattice spacing c" is a variation rate of the lattice spacing c with respect to the lattice spacing of a reference diffraction pattern in the grain, and can be derived from the following formula (3).

$$\text{distortion (\%)} = (\text{lattice spacing } c - \text{lattice spacing } c \text{ of reference diffraction pattern in grain})/\text{lattice spacing } c \text{ of reference diffraction pattern in grain} \times 100 \quad (3)$$

"Distortion of the lattice spacing c in the extending direction" is distortion in the case where the lattice spacing c is larger than the lattice spacing of the reference diffraction pattern in the grain, and is a positive value. "Distortion of the lattice spacing c in the contraction direction" is distortion in the case where the lattice spacing c is smaller than the lattice spacing of the reference diffraction pattern in the grain, and is a negative value.

1.3. Features

The piezoelectric element 100 has, for example, the following features.

In the piezoelectric layer 20 of the piezoelectric element 100, the ratio c/a satisfies the relationship of $0.986 \leq c/a \leq 1.014$ in the range α (or, for example, in the range β). Therefore, in the piezoelectric element 100, as will be described in "Examples" that will be described later, for example, the amount of displacement can be increased, and thus a good piezoelectric characteristic can be achieved.

For example, in the piezoelectric layer 20 of the piezoelectric element 100, in the range α, the maximum value of the distortion of the lattice spacing c in the extending direction is 2.05% or smaller. Therefore, the piezoelectric element 100 has a good piezoelectric characteristic more certainly.

For example, in the piezoelectric layer 20 of the piezoelectric element 100, in the range β, the difference between the maximum value of the distortion of the lattice spacing c in the extending direction and the minimum value of the distortion of the lattice spacing c in the contraction direction is 2.26% or smaller. Therefore, the piezoelectric element 100 has a good piezoelectric characteristic more certainly.

For example, in the piezoelectric element 100, the second electrode 30 includes the conductive layer 32 that is an iridium oxide layer provided on the piezoelectric layer and also includes the conductive layer 34 that is a titanium oxide layer on the conductive layer 32. Therefore, in the piezoelectric element 100, due to the iridium oxide layer, occurrence of an oxygen defect that is a killer defect in the piezoelectric layer 20 can be suppressed, and temporal degradation of the piezoelectric characteristic can be suppressed. Further, in the piezoelectric element 100, due to the titanium oxide layer, ion migration in the second electrode 30 and the conductive layers 32 and 34 can be suppressed. Further, in the piezoelectric element 100, due to the iridium oxide layer and the titanium oxide layer, compressive stress can be more easily generated in the piezoelectric layer 20.

For example, in the piezoelectric element 100, the second electrode 30 includes the conductive layer 32 that is an SRO layer provided on the piezoelectric layer 20 and also includes the conductive layer 34 that is a platinum layer on the conductive layer 32. Therefore, in the piezoelectric element 100, due to the SRO layer, occurrence of an oxygen defect that is a killer defect in the piezoelectric layer 20 can be suppressed, and temporal degradation of the piezoelectric characteristic can be suppressed. Further, since SRO has a perovskite structure similarly to PZT, SRO has a good bonding property with a piezoelectric layer formed of PZT, and can be epitaxially grown on the piezoelectric layer. Further, SRO has a smaller lattice constant than PZT (SRO: 3.92 Å, PZT: 4.06 Å), and thus can make it easier to generate compressive stress in the piezoelectric layer 20. Further, SRO can suppress missing of lead from PZT. Further, in the piezoelectric element 100, the platinum layer can have excellent oxidation resistance and high electrical conductivity.

2. PRODUCTION METHOD OF PIEZOELECTRIC ELEMENT

Figure 2:
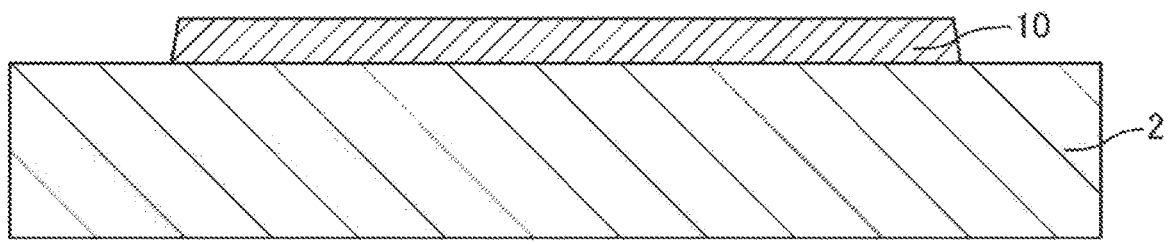
FIG. 2 is a schematic section view of the piezoelectric element according to the embodiment schematically illustrating a production process thereof.

Next, a production method of the piezoelectric element 100 according to the present embodiment will be described with reference to drawings. FIG. 2 is a schematic section view of the piezoelectric element 100 according to the present embodiment schematically illustrating a production process thereof.

As illustrated in FIG. 2, the substrate 2 is prepared. Specifically, a silicon oxide layer is formed by thermally oxidizing a silicon substrate. Next, a zirconium layer is formed on the silicon oxide layer by a sputtering method or the like, and a zirconium oxide layer is formed by oxidizing the zirconium layer. The substrate 2 can be prepared in accordance with the steps described above.

Next, the first electrode 10 is formed on the substrate 2. The first electrode 10 is formed by, for example, film formation by a sputtering method or a vacuum deposition method and patterning (patterning by photolithography and etching).

As illustrated in FIG. 1, the piezoelectric layer 20 is formed on the first electrode 10. The piezoelectric layer 20 is formed by, for example, a liquid phase method such as a sol-gel method or metal organic deposition (MOD). The piezoelectric layer 20 is formed by repeating the series of steps including the application step, the drying step, the degreasing step, and the firing step a plurality of times.

For example, a specific procedure of forming the piezoelectric layer 20 by a solution method is as follows. First, a precursor solution containing predetermined metal complexes is prepared. The precursor solution is obtained by dissolving or dispersing, in an organic solvent, metal complexes that can form PZT by firing.

The prepared precursor solution is applied on the first electrode 10 by using a spin coating method to form a precursor layer (application step). Next, the precursor layer is heated to, for example, about 130° C. to 250° C. and dried for a certain period (drying step). Further, the dried precursor layer is degreased by heating the precursor layer and keeping the precursor layer at, for example, about 300° C. to 450° C. for a certain period (degreasing step). Next, the degreased precursor layer is crystallized by heating the precursor layer and keeping the precursor layer at, for example, about 650° C. to 800° C. for a certain period (firing step). Then, the series of steps from the application step to the firing step described above is repeated a plurality of times to form the piezoelectric layer 20.

Examples of a metal complex containing lead include lead acetate. Examples of a metal complex containing zirconium include zirconium acetylacetonate, zirconium tetraacetylacetonate, zirconium monoacetylacetonate, and zirconium bisacetylacetonate. Examples of a metal complex containing titanium include, for example, titanium alkoxides such as titanium isopropoxide. Examples of the solvent for the metal complexes include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, and mixture solvents of these.

The metal complexes are mixed such that, for example, the ratio (Pb/(Zr+Ti)) of the molar number of Pb with respect to the total molar number of Zr and Ti is 1.1 to 1.25. That is, the metal complexes are mixed such that the ratio of molar number satisfies Pb:(Zr+Ti)=1.1 to 1.25:1.

Examples of a heating apparatus used in the drying step, the degreasing step, and the firing step include a rapid thermal annealing (RTA) apparatus that performs heating by radiation of infrared light.

Next, the piezoelectric layer 20 is subjected to patterning. The patterning is performed by, for example, photolithography and etching.

Next, the second electrode 30 is formed on the piezoelectric layer 20, and the conductive layer 34 is formed on the second electrode 30. The second electrode 30 and the conductive layer 34 are formed by, for example, forming a first metal layer on the piezoelectric layer 20 and a second metal layer on the first metal layer by a sputtering method, heating the first metal layer and the second metal layer in, for example, oxygen atmosphere, and then performing patterning.

The piezoelectric element 100 can be prepared in accordance with the steps described above.

3. LIQUID EJECTING HEAD

Figure 3:
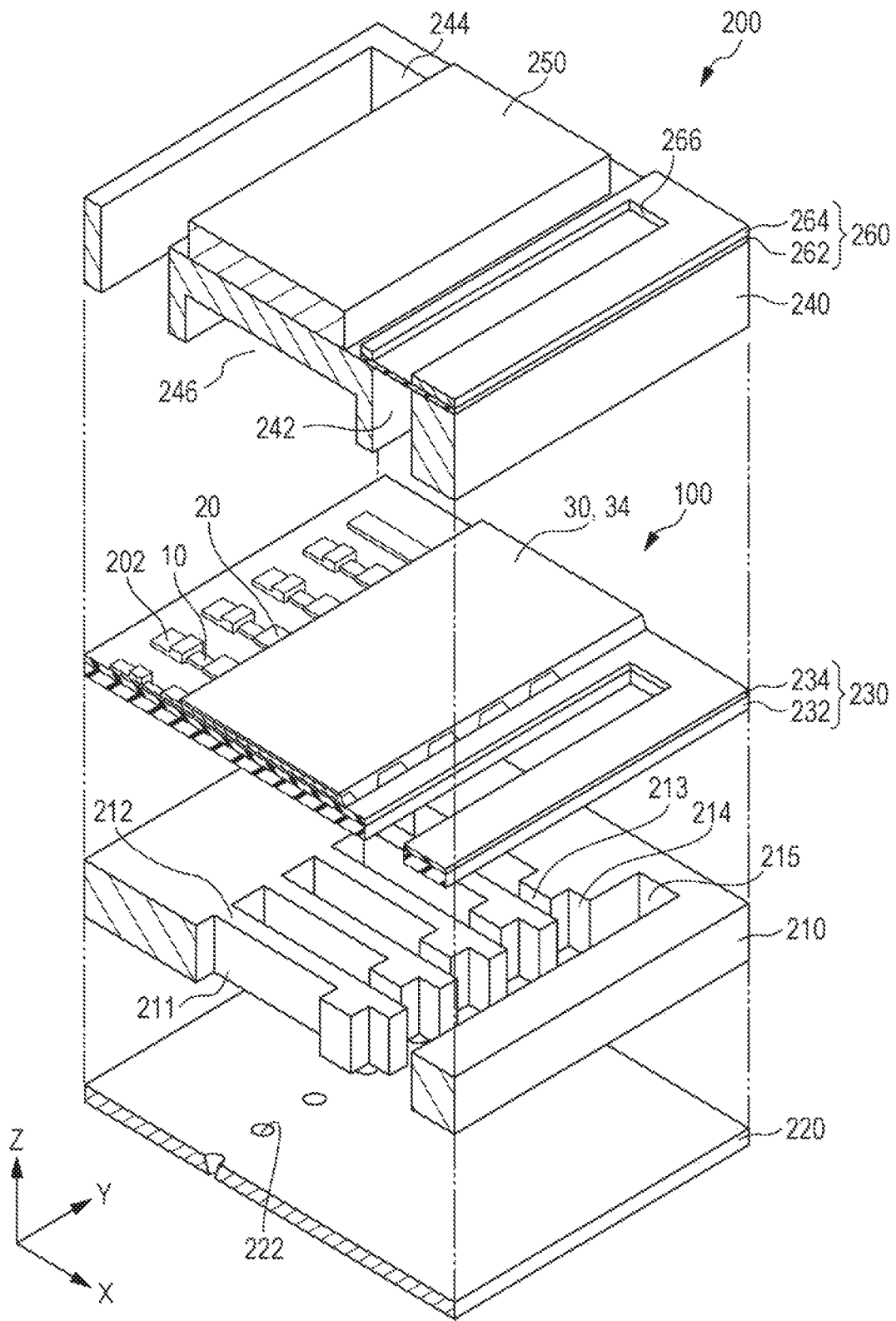
FIG. 3 is a schematic exploded perspective view of a liquid ejecting head according to the embodiment.
Figure 4:
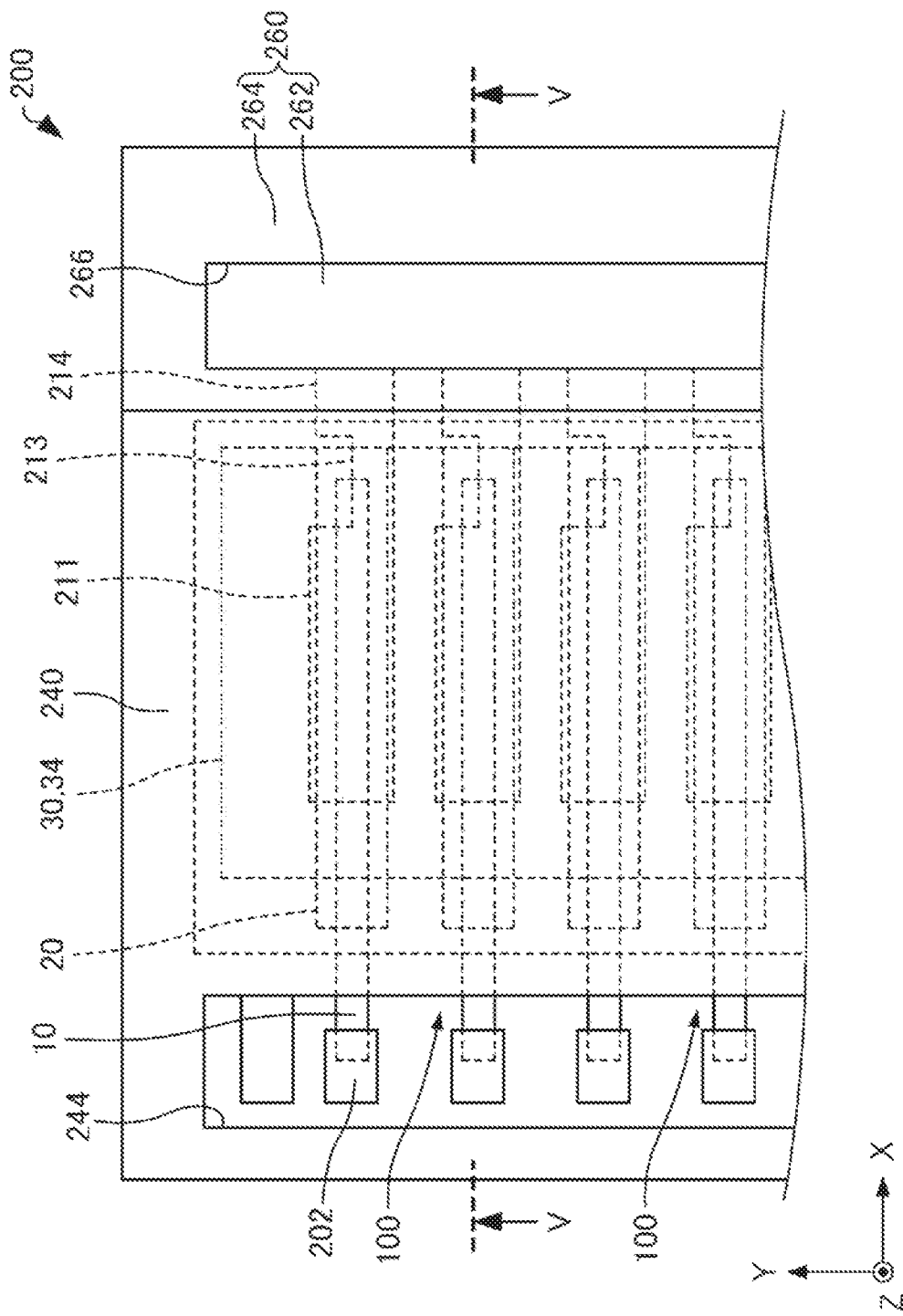
FIG. 4 is a schematic plan view of the liquid ejecting head according to the embodiment.
Figure 5:
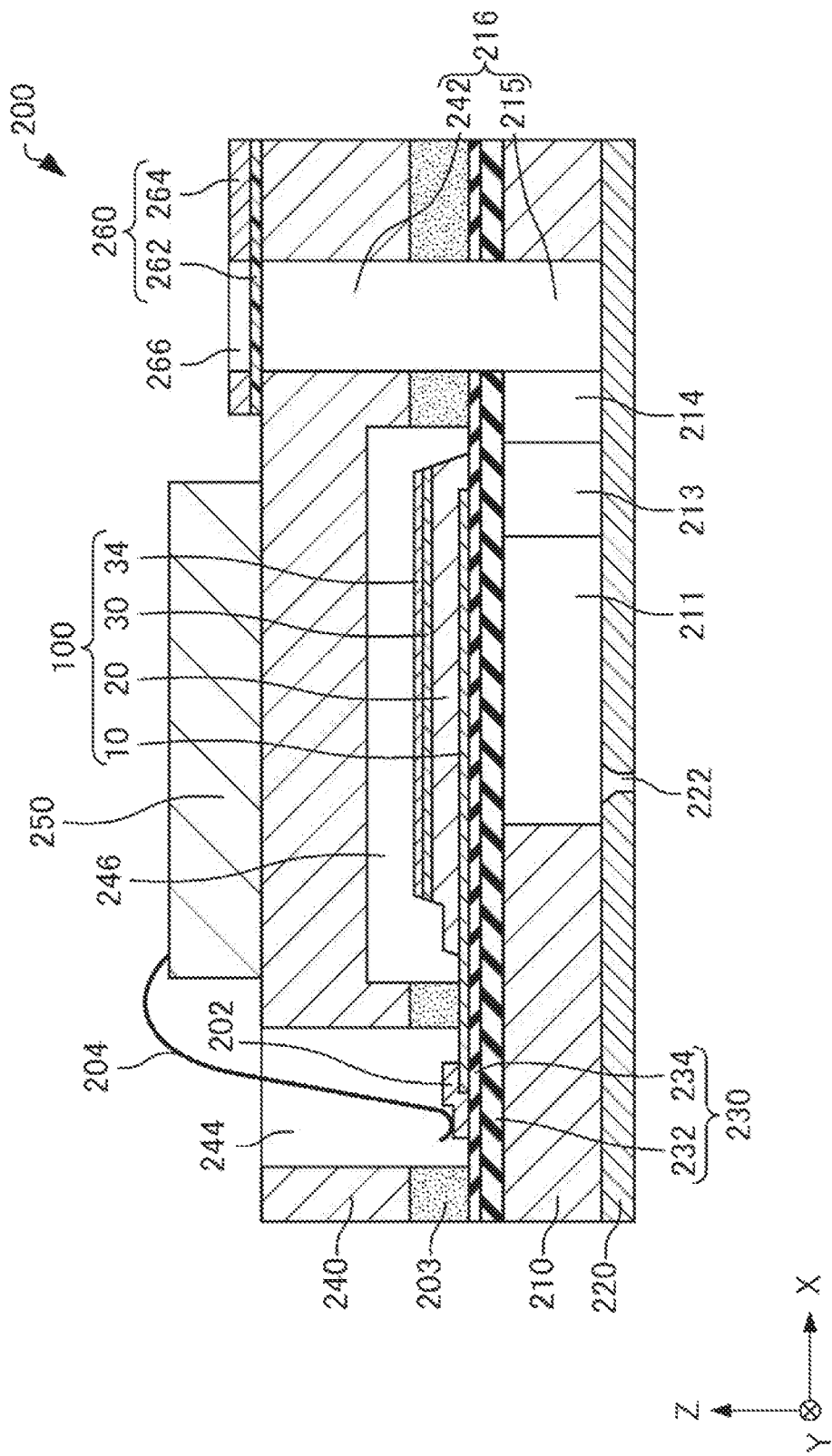
FIG. 5 is a schematic section view of the liquid ejecting head according to the embodiment.

Next, a liquid ejecting head according to the present embodiment will be described with reference to drawings. FIG. 3 is a schematic exploded perspective view of a liquid ejecting head 200 according to the present embodiment. FIG. 4 is a schematic plan view of the liquid ejecting head 200 according to the present embodiment. FIG. 5 is a schematic section view of the liquid ejecting head 200 according to the present embodiment taken along a line V-V of FIG. 4. To be noted, an X axis, a Y axis, and a Z axis are shown as three axes perpendicular to one another in FIGS. 3 to 5.

A liquid ejecting head according to the invention includes the piezoelectric element according to the invention. The liquid ejecting head 200 including the piezoelectric element 100 will be described below as an example.

As illustrated in FIGS. 3 to 5, the liquid ejecting head 200 includes, for example, the piezoelectric element 100, a channel-defining substrate 210, a nozzle plate 220, a diaphragm 230, a protective substrate 240, a circuit board 250, and a compliance substrate 260. To be noted, illustration of the circuit board 250 and connection wiring 204 is omitted in FIG. 5 for the sake of convenience.

The channel-defining substrate 210 is, for example, a silicon substrate. Pressure generating chambers 211 are provided in the channel-defining substrate 210. The pressure generating chambers 211 are partitioned by a plurality of partition walls 212.

In the channel-defining substrate 210, an ink supply path 213 and a communication path 214 are provided at an end portion of each of the pressure generating chambers 211 on the +X side. The ink supply path 213 is defined such that the opening area thereof shrinks when the end portion of the pressure generating chamber 211 on the +X side is squeezed in the Y axis direction. The size of the communication path 214 in the Y axis direction is, for example, the same as the size of the pressure generating chamber 211 in the Y axis direction. A communication portion 215 is provided on the +X side of the communication path 214. The communication portion 215 constitutes part of a manifold 216. The manifold 216 serves as a common ink chamber of the pressure generating chambers 211. As described above, liquid channels each including the pressure generating chamber 211, the ink supply path 213, the communication path 214, and the communication portion 215 are defined in the channel-defining substrate 210.

The nozzle plate 220 is provided on one surface (surface on the −Z side) of the channel-defining substrate 210. The material of the nozzle plate 220 is for example, steel use stainless (SUS). The nozzle plate 220 is joined to the channel-defining substrate 210 by, for example, a glue or a heat sealing film. Nozzle openings 222 are arranged along the Y axis in the nozzle plate 220. The nozzle openings 222 communicate with the pressure generating chambers 211.

The diaphragm 230 is provided on the other surface (surface on the +Z side) of the channel-defining substrate 210. The diaphragm 230 is constituted by, for example, a first insulator layer 232 formed on the channel-defining substrate 210 and a second insulator layer 234 provided on the first insulator layer 232. The first insulator layer 232 is, for example, a silicon oxide layer. The second insulator layer 234 is, for example, a zirconium oxide layer.

The piezoelectric element 100 is provided on, for example, the diaphragm 230. The piezoelectric element 100 is provided in a plural number. The number of the piezoelectric elements 100 is not particularly limited.

In the liquid ejecting head 200, the diaphragm 230 and the first electrodes 10 are displaced by deformation of the piezoelectric layers 20 having an electromechanical conversion characteristic. That is, in the liquid ejecting head 200, the diaphragm 230 and the first electrodes 10 substantially has a function as a diaphragm. To be noted, the diaphragm 230 may be omitted and the first electrodes 10 may be configured to function as a diaphragm by themselves. In the case of providing the first electrodes 10 directly on the channel-defining substrate 210, it is preferable to protect the first electrodes 10 by an insulating protective film or the like such that ink does not directly contact the first electrodes 10.

The first electrodes 10 are each configured as an individual electrode independent for each of the pressure generating chamber 211. The size of the first electrode 10 in the Y axis direction is, for example, smaller than the size of the pressure generating chamber 211 in the Y axis direction. The size of the first electrode 10 in the X axis direction is, for example, smaller than the size of the pressure generating chamber 211 in the X axis direction. Both end portions of the first electrode 10 in the X axis direction are positioned further on the outside than both end portions of the pressure generating chamber 211. A leading electrode 202 is connected to the end portion of the first electrode 10 on the −X side.

The size of the piezoelectric layer 20 in the Y axis direction is, for example, larger than the size of the first electrode 10 in the Y axis direction. The size of the piezoelectric layer 20 in the X axis direction is, for example, larger than the size of the pressure generating chamber 211 in the X axis direction. The end portion of the piezoelectric layer 20 on the +X side is, for example, positioned further on the outside (on the +X side) than the end portion of the first electrode 10 on the +X side. That is, the end portion of the first electrode 10 on the +X side is covered by the piezoelectric layer 20. Meanwhile, the end portion of the piezoelectric layer 20 on the −X side is, for example, positioned further on the inside (on the +X side) than the end portion of the first electrode 10 on the −X side. That is, the end portion of the first electrode 10 on the −X side is not covered by the piezoelectric layer 20.

The second electrode 30 is continuously provided on the piezoelectric layers 20, the first electrodes 10, and the diaphragm 230. The second electrode 30 is configured as a common electrode shared by a plurality of piezoelectric elements 100. The conductive layer 34 is configured as a common conductive layer shared by the plurality of piezoelectric elements 100. To be noted, although not illustrated, the first electrode 10 instead of the second electrode 30 may be configured as a common electrode.

The protective substrate 240 is joined to the channel-defining substrate 210 by a glue 203. The protective substrate 240 is provided with a through hole 242. In the illustrated example, the through hole 242 penetrates through the protective substrate 240 in the Z axis direction and communicates with the communication portion 215. The through hole 242 and the communication portion 215 constitute the manifold 216 serving as a common ink chamber for the pressure generating chambers 211. Further, the protective substrate 240 is provided with a through hole 244 penetrating through the protective substrate 240 in the Z axis direction. End portions of the leading electrodes 202 are positioned at the through hole 244.

The protective substrate 240 is provided with an opening portion 246. The opening portion 246 is a space for not hindering driving of the piezoelectric elements 100. The opening portion 246 may be sealed or not sealed.

The circuit board 250 is provided on the protective substrate 240. The circuit board 250 includes a semiconductor integrated circuit (IC) for driving the piezoelectric elements 100. The circuit board 250 and the leading electrodes 202 are electrically interconnected via the connection wiring 204.

The compliance substrate 260 is provided on the protective substrate 240. The compliance substrate 260 includes a sealing layer 262 provided on the protective substrate 240 and a fixing board 264 provided on the sealing layer 262. The sealing layer 262 is a layer for sealing the manifold 216. For example, the sealing layer 262 is flexible. The fixing board 264 is provided with a through hole 266. The through hole 266 penetrates through the fixing board 264 in the Z axis direction. The through hole 266 is provided at such a position as to overlap the manifold 216 in plan view (as viewed in the Z axis direction).

A liquid ejecting head 200 includes the piezoelectric element 100 having a good piezoelectric characteristic. Therefore, in the liquid ejecting head 200, the amount of displacement of the diaphragm 230 is large.

4. PRINTER

Figure 6:
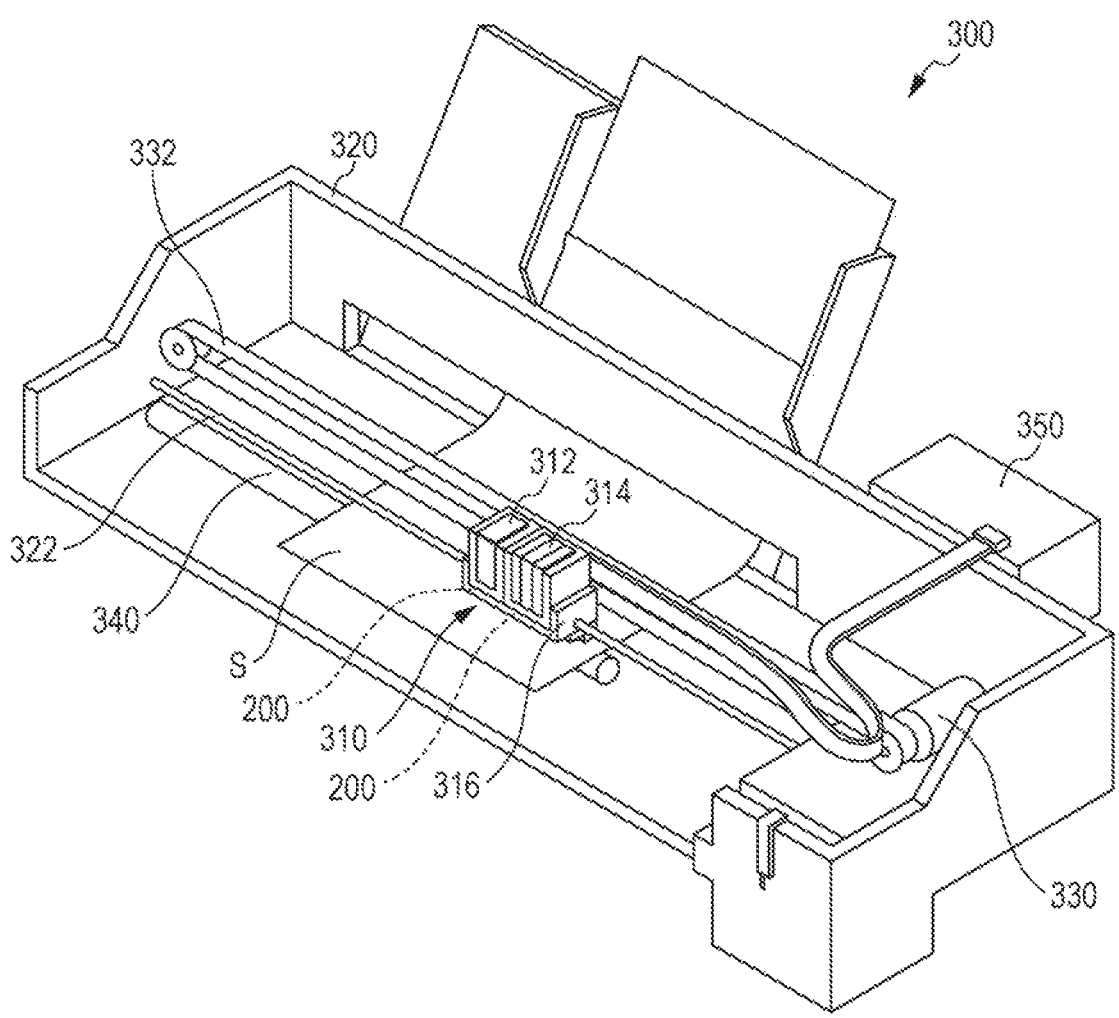
FIG. 6 is a schematic perspective view of a printer according to the embodiment.

Next, a printer according to the present embodiment will be described with reference to drawings. FIG. 6 is a schematic perspective view of a printer 300 according to the present embodiment.

A printer according to the invention includes the liquid ejecting head according to the invention. The printer 300 including the liquid ejecting head 200 will be described below as an example.

The printer 300 is an ink jet printer. As illustrated in FIG. 6, the printer 300 includes a head unit 310. The head unit 310 includes liquid ejecting heads 200. The number of the liquid ejecting heads 200 is not particularly limited. Cartridges 312 and 314 constituting an ink supply unit are attachably and detachably provided in the head unit 310. A carriage 316 mounting the head unit 310 is provided, on a carriage shaft 322 attached to an apparatus body 320, so as to be movable in the shaft direction, and for example, ejects a black ink composition and color ink compositions.

In the printer 300, the carriage 316 mounting the head unit 310 is moved along the carriage shaft 322 as a result of driving force of a driving motor 330 being transmitted to the carriage 316 via a plurality of unillustrated gears and a timing belt 332. Meanwhile, the apparatus body 320 is provided with a transport roller 340 serving as a transport unit, and a recording sheet S that is a recording medium of paper or the like is transported by the transport roller 340. The transport unit that transports the recording sheet S is not limited to a transport roller, and may be a belt, a drum, or the like.

The printer 300 includes a printer controller 350. The printer controller 350 is electrically connected to the circuit board 250 (see FIG. 5) of the liquid ejecting head 200. The printer controller 350 includes, for example, a control unit, a driving signal generating circuit, and so forth. The control unit includes a random access memory (RAM) that temporarily stores various data, a read only memory (ROM) storing a control program and the like, a central processing unit (CPU), and so forth. The driving signal generating circuit generates a driving signal to be supplied to the liquid ejecting head 200.

The printer 300 includes the liquid ejecting head 200 whose amount of displacement of the diaphragm 230 is large. Therefore, the printer 300 can eject an ink onto the recording sheet S with low power consumption.

5. EXPERIMENTAL EXAMPLES

The invention will be described more in detail with reference to the following experimental examples. To be noted, the invention should not be limited by the following experimental examples.

5.1. First Experiment

5.1.1. Sample Used for Experiment (1) Example 1

In Example 1, a Si [110] substrate was prepared, and a $SiO_2$ layer was formed by thermally oxidizing the Si substrate. Next, a Zr layer was formed on the $SiO_2$ layer by a sputtering method, and a $ZrO_2$ layer was formed by thermally oxidizing the Zr layer. In this manner, a diaphragm constituted by the $SiO_2$ layer and the $ZrO_2$ layer was formed. The thickness of the $SiO_2$ layer was set to 520 nm, and the thickness of the $ZrO_2$ layer was set to 200 nm.

Next, by the sputtering method, a Ti layer (firm contact layer), a Pt layer (first electrode), an Ir layer (first electrode), and a Ti layer (orientation control layer) were formed on the $ZrO_2$ layer in this order. The thickness of the Ti layer (firm contact layer) was set to 20 nm, the thickness of the Pt layer was set to 50 nm, the thickness of the Ir layer was set to 5 nm, and the thickness of the Ti layer (orientation control layer) was set to 4 nm.

Next, a PZT layer (piezoelectric layer) was formed on the Ti layer by a sol-gel method. Specifically, the PZT layer was formed by repeating the application step, the drying step, the degreasing step, and the firing step 4 times. In the firing step, heating was performed for 5 minutes at a heating temperature (firing temperature) of 725° C. in an RTA apparatus. The charging composition was Pb:Zr:Ti=120:52:48 in molar ratio. The thickness of the PZT layer was 760 nm.

Next, an Ir layer was formed on the PZT layer by the sputtering method. Regarding the conditions of the sputtering method, a substrate of a sputtering apparatus was heated for 40 seconds at 250° C., a direct current (DC) power source of the sputtering apparatus was operated for 35.4 seconds at 100 W, and the flow amount of an Ar gas serving as a sputtering gas was set to 30 sccm. The thickness of the Ir layer was 5 nm.

Next, a Ti layer was formed on the Ir layer by the sputtering method. Regarding the conditions of the sputtering method, the direct current (DC) power source of the sputtering apparatus was operated for 35.4 seconds at 100 W, and the flow amount of the Ar gas serving as a sputtering gas was set to 30 sccm. The thickness of the Ti layer was 4 nm.

Next, the sample was heated for 8 minutes at 720° C. in an oxygen atmosphere, and thus the Ir layer was oxidized to be an $IrO_2$ layer (second electrode) and the Ti layer was oxidized to be a $TiO_2$ layer (conductive layer).

(2) Comparative Example 1

Comparative Example 1 is the same as Example 1 except that the time for heating at 720° C. in the oxygen atmosphere after formation of the Ir layer was changed to 2 minutes. In Comparative Example 1, since the time for heating was short, the Ir layer became an $IrO_x$ layer (0<x<2), and the Ti layer became an $TiO_y$ layer (0<y<2).

5.1.2. Measurement of Lattice Spacing in Depth Direction of PZT Layer

In Example 1 and Comparative Example 1, the lattice spacing of the PZT layer was measured. A scanning transmission analysis electron microscope JEM-ARM 200F (manufactured by JEOL Ltd., accelerating voltage: 200 kV) was used for the measurement. ONE-VIEW STEMx system (manufactured by GATAN) was used as a camera system. An approximately parallel electron beam having a spot diameter of about φ 3 nm was incident on an arbitrary columnar crystal grain of PZT [100] of a pc orientation in a <100> pc direction in the vicinity of the second electrode (µµDIFF mode). A nano beam electron diffraction pattern (NBD) obtained thereby was matched with the scanning lines, and thus a 4D-STEM image (width 150 nm×height 300 nm) of a 4D distribution of the real space and the reciprocal space was obtained. Then, distortion of each point in the reference diffraction pattern of inside of crystal grain was automatically measured to display a distortion map image. Specifically, as can be derived from the formula (3), distortion of the lattice spacing a ($\varepsilon_{xx}$) and distortion of the lattice spacing c ($\varepsilon_{yy}$) were displayed. To be noted, the "lattice spacing c of the reference diffraction pattern in the grain" of the formula (3) was 4.07 Å. In addition, the distortion of the lattice spacing a and the distortion of the lattice spacing c were converted into axial lengths (1+$\varepsilon_{xx}$, 1+$\varepsilon_{yy}$), and a map image of the ratio c/a thereof was displayed.

Figure 7:
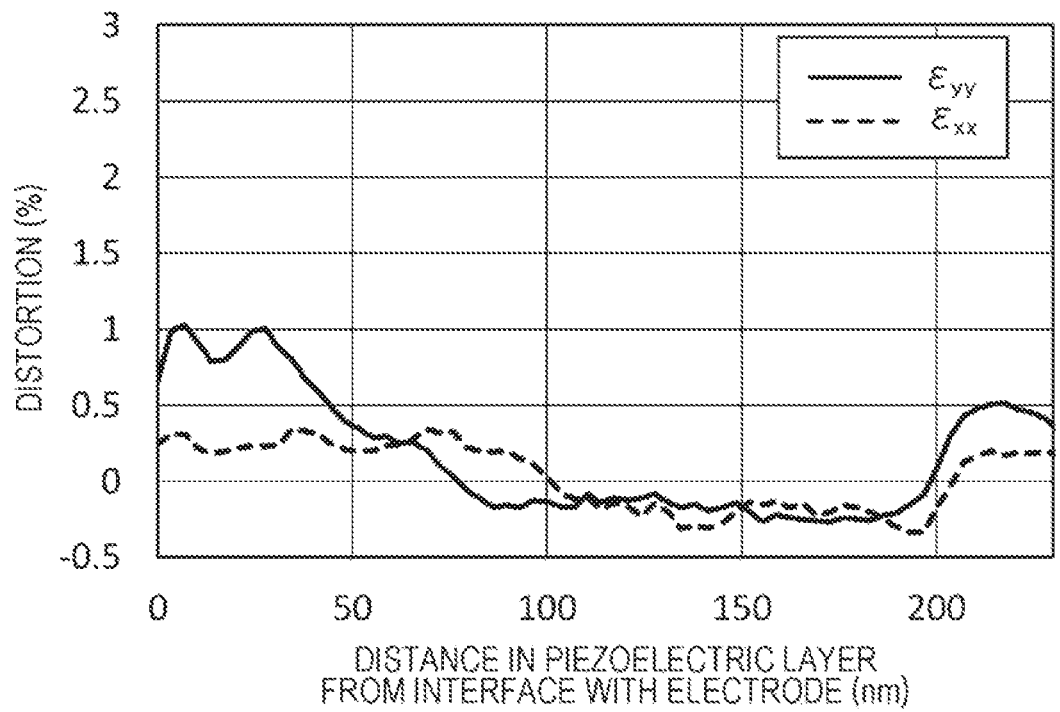
FIG. 7 is a graph illustrating a relationship between the distance in a piezoelectric layer from an interface with an electrode and distortion of lattice spacing in Example 1.
Figure 8:
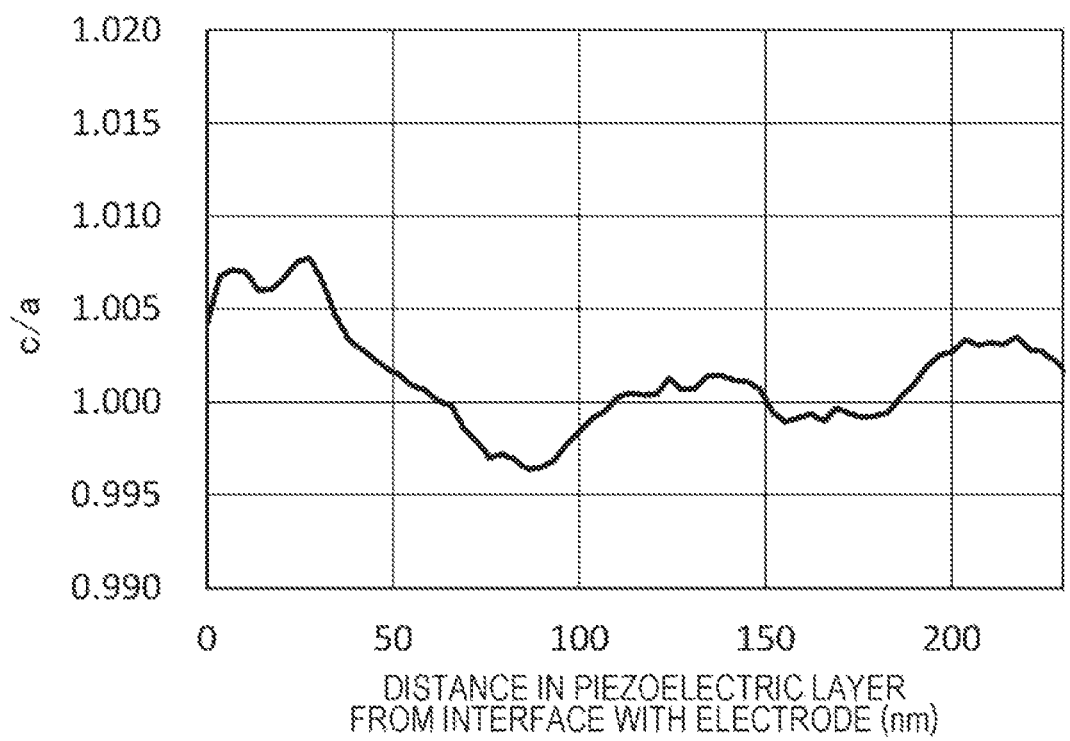
FIG. 8 is a graph illustrating a relationship between the distance in the piezoelectric layer from the interface with the electrode and a ratio c/a in Example 1.
Figure 9:
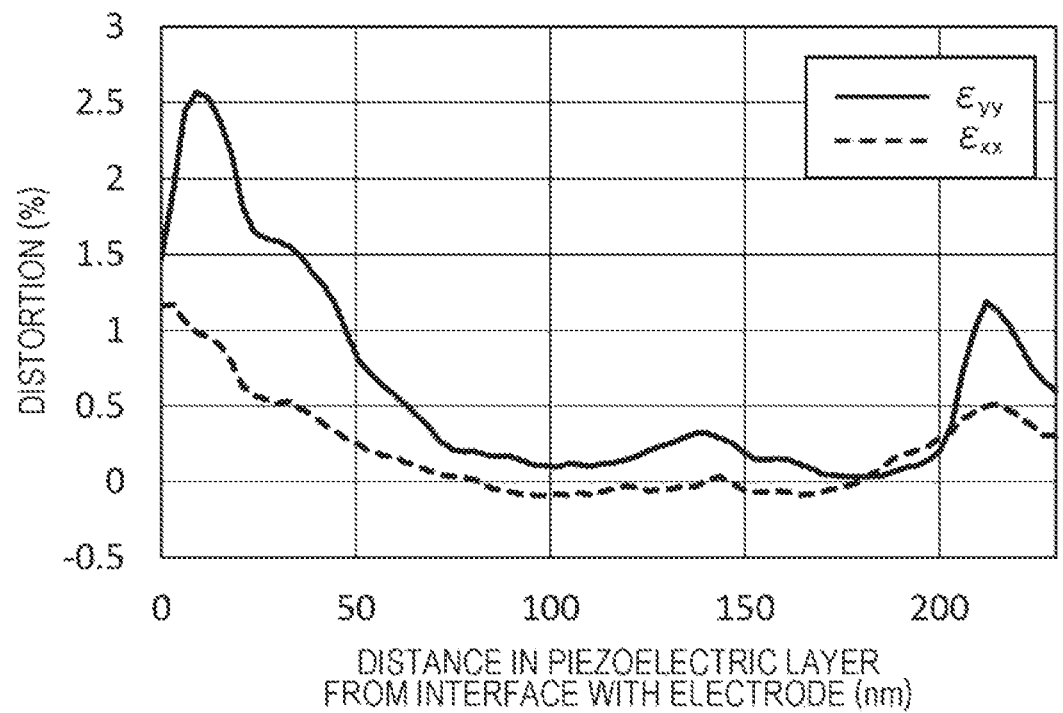
FIG. 9 is a graph illustrating a relationship between the distance in the piezoelectric layer from the interface with the electrode and distortion of lattice spacing in Comparative Example 1.
Figure 10:
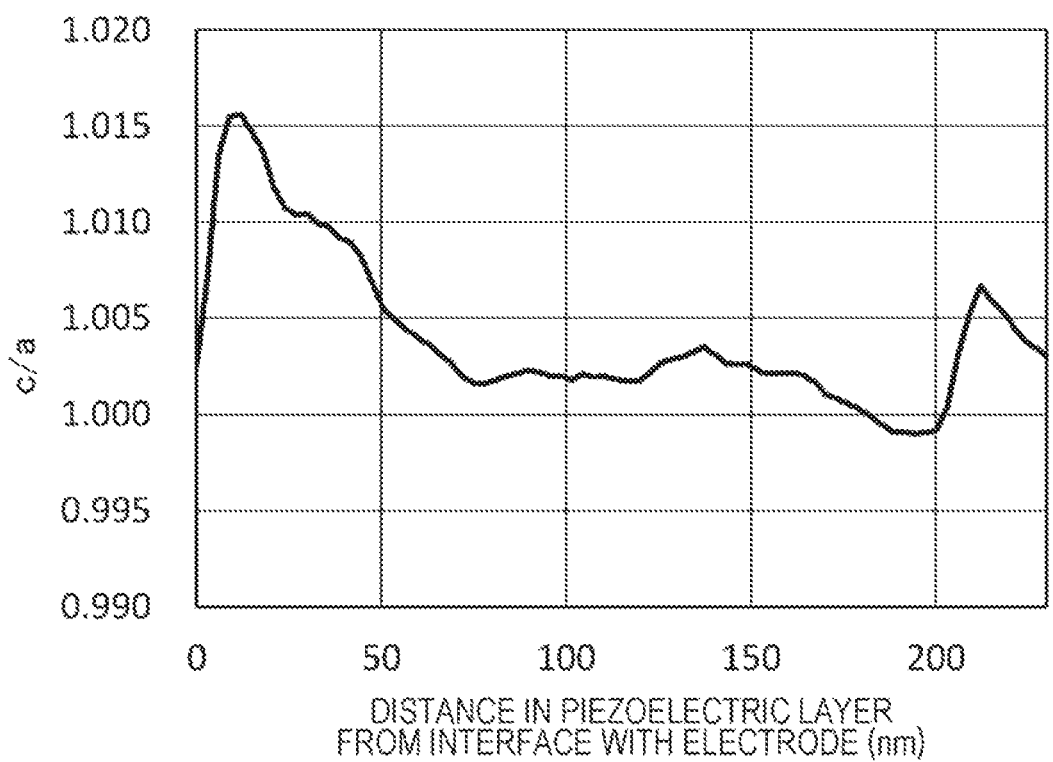
FIG. 10 is a graph illustrating a relationship between the distance in the piezoelectric layer from the interface with the electrode and the ratio c/a in Comparative Example 1.

FIG. 7 is a graph illustrating a relationship between the distance in the piezoelectric layer from the interface with the electrode and distortions $\varepsilon_{xx}$ and $\varepsilon_{yy}$ of lattice spacings a and c in Example 1. FIG. 8 is a graph illustrating a relationship between the distance in the piezoelectric layer from the interface with the electrode and the ratio c/a in Example 1. FIG. 9 is a graph illustrating a relationship between the distance in the piezoelectric layer from the interface with the electrode and the distortions $\varepsilon_{xx}$ and $\varepsilon_{yy}$ in Comparative Example 1. FIG. 10 is a graph illustrating a relationship between the distance in the piezoelectric layer from the interface with the electrode and the ratio c/a in Comparative Example 1.

In FIGS. 7 and 9, the distortion is an average value of 30 points in a plane. That is, for example, a distortion of 50 nm shown in FIG. 7 is an average value of distortion of 30 points measured at different positions in the in-plane direction (direction perpendicular to the thickness direction) at a distance of 50 nm in the piezoelectric layer from the interface with the electrode.

In FIGS. 7 and 9, the horizontal axis indicates a distance in the thickness direction in the piezoelectric layer from the interface (distance in the piezoelectric layer from the interface with the electrode) in a profile from the second electrode to the first electrode in which the distortion was measured with the interface between the piezoelectric layer and the second electrode as a distance of 0. The position of the interface between the piezoelectric layer and the second electrode was specified by contrasting the profile with the 4D-STEM image. FIGS. 7 to 10 show profiles to a distance of 230 nm in the piezoelectric layer from the interface with the electrode.

Values of c/a in FIGS. 8 and 10 were respectively obtained by calculating $(1+\varepsilon_{yy}/100)/(1+\varepsilon_{xx}/100)$ on the basis of the distortions $\varepsilon_{xx}$ and $\varepsilon_{yy}$ shown in FIGS. 7 and 9.

FIG. 11 is a table showing the maximum value $(c/a)_{MAX}$ of the ratio c/a, the maximum value $\varepsilon_{yyMAX}$ of the distortion $\varepsilon_{yy}$ of the lattice spacing c, and difference $\Delta(\varepsilon_{yyMAX}-\varepsilon_{yyMIN})$ between the maximum value $\varepsilon_{yyMAX}$ and the minimum value $\varepsilon_{yyMIN}$ of the distortion $\varepsilon_{yy}$ of the lattice spacing c obtained from the results of FIGS. 7 to 10. To be noted, FIG. 11 also shows the amount of displacement and difference of amount of displacement after use (details will be described later).

In Example 1, the measurement of lattice spacing in the thickness direction was performed a plurality of times while changing a target region of measurement (columnar crystal to be subjected to measurement). In FIG. 11, a range of values obtained by the plurality of times of measurement is shown. Similarly, also in Comparative Example 1, the measurement of lattice spacing in the thickness direction was performed a plurality of times.

The values of $(c/a)_{MAX}$, $\varepsilon_{yyMAX}$, and $\Delta(\varepsilon_{yyMAX}-\varepsilon_{yyMIN})$ shown in FIG. 11 were measured in the range β of 230 nm or smaller from the interface between the piezoelectric layer and the second electrode (interface with the electrode). To be noted, $(c/a)_{MAX}$ and $\varepsilon_{yyMAX}$ were recognized in the range α of 50 nm or smaller from the interface with the electrode.

As illustrated in FIG. 11, the values of $(c/a)_{MAX}$, $\varepsilon_{yyMAX}$, and $\Delta(\varepsilon_{yyMAX}-\varepsilon_{yyMIN})$ were smaller in Example 1 than in Comparative Example 1. The difference in these parameters between Example 1 and Comparative Example 1 is considered to be related to the stress generated in the PZT layer depending on the material of the second electrode. In the case of $IrO_2$, as compared with the case of $IrO_x$, the maximum value of the compressive stress generated in the PZT layer is small, and the crystal structure of the PZT layer tends to be close to cubic. Therefore, it can be considered that the parameters described above became smaller in Example 1 because of this. To be noted, the parameters described above are considered to be also related to the material of the conductive layer on the second electrode.

5.1.3. Measurement of Amount of Displacement

The amount of displacement (amount of displacement of the diaphragm) of Example 1 and Comparative Example 1 was measured. The amount of displacement of the diaphragm (amount of displacement with respect to a state in which no voltage was applied) was obtained while applying a voltage of 25 V between the first electrode and the second electrode. In addition, in Example 1 and Comparative Example 1, the diaphragm was displaced $1.9 \times 10^{10}$ times by applying a pulse of driving waveform between the first electrode and the second electrode, and difference in the amount of displacement before and after application of the pulse of driving waveform (difference in the amount of displacement after use) was obtained. To be noted, for the measurement of amount of displacement, a laser Doppler vibrometer was used. FIG. 11 shows the amount of displacement of Example 1 and Comparative Example 1. In addition, FIG. 11 shows the difference in amount of displacement after use of Example 1 and Comparative Example 1. To be noted, in FIG. 11, the amount of displacement is shown as a relative ratio in the case where the amount of displacement of Comparative Example 1 is "1".

As illustrated in FIG. 11, the amount of displacement was larger in Example 1 than in Comparative Example 1. Therefore, it was found that Example 1 has a better piezoelectric characteristic than Comparative Example 1.

As illustrated in FIG. 11, since $(c/a)_{MAX}$ is 1.015 or larger in Comparative Example 1, it can be considered that the crystal structure of the PZT layer tends to be closer to cubic and the amount of displacement increases in the case where $(c/a)_{MAX}$ is 1.014 or smaller. Therefore, it was found that the amount of displacement increases in the case where the ratio c/a is 1.014 or smaller in the range α of 50 nm or smaller from the interface with the electrode in the thickness direction.

Here, in the case where c/a is 1.014, compressive stress is generated in the PZT layer, and difference in c/a from the case where the crystal structure is cubic (c/a=1) is 0.014. Therefore, it can be considered that, even in the case where tensile stress is generated in the PZT layer, the amount of displacement increases if the difference in c/a from a cubic structure is 0.014. Therefore, it can be considered that the amount of displacement can be increased as long as the formula (1) is satisfied.

$$0.986 \leq c/a \leq 1.014 \tag{1}$$

In this manner, by this experiment, it was found that the ratio c/a in the range of 50 nm or smaller in the piezoelectric layer from the interface with the second electrode, which is the vicinity of the interface, is correlated with the amount of displacement. In Example 1, a neutral plane is at the position of the diaphragm, and a portion farther from the neutral plane (portion of the piezoelectric layer on the second electrode side) greatly affects the displacement of the diaphragm (has a high sensitivity for displacement). To be noted, "a neutral plane is at the position of the diaphragm" means that the diaphragm is in a no-distortion plane (plane without distortion). That is, when the diaphragm warps due to application of voltage, the neutral plane serves as the standard of the warpage. Therefore, tensile stress is generated on a lower layer side (for example, the pressure generating chamber side in the case where the piezoelectric element is used for a liquid ejecting head) of the neutral plane, and compressive stress is generated on the upper layer side of the neutral plane. According to this, warpage can be efficiently generated on the pressure generating chamber side.

In Example 1, in the range β of 230 nm or smaller from the interface with the electrode in the thickness direction, the minimum value $(c/a)_{MIN}$ of was 0.991 to 0.9964. Therefore, it was found that Example 1 satisfies the formula (1) in the range α and the range β.

However, in the case where tensile stress is generated in the PZT layer, there is a case where, due to the stress, the PZT layer undergoes phase transition to be deviated from the morphotropic phase boundary and the amount of displacement decreases. From this viewpoint, it is more preferable that compressive stress is generated in the PZT layer, and it can be considered that the amount of displacement can be increased more certainly when $1<(c/a)_{MAX} \leq 1.014$ is satisfied.

Further, as illustrated in FIG. 11, since $\varepsilon_{yyMAX}$ is 2.06% or larger in Comparative Example 1, it was found that the compressive stress generated in the PZT layer can be reduced and the amount of displacement can be increased more certainly when $\varepsilon_{yyMAX}$ is 2.05% or smaller. Therefore, in the range α, the amount of displacement can be increased more certainly when the distortion $\varepsilon_{yy}$ of the lattice spacing c in the extending direction satisfies the following formula (4). It was found that Example 1 satisfies the formula (4).

$$\varepsilon_{yy} \leq 2.05\% \quad (4)$$

Further, as illustrated in FIG. 11, since $\Delta(\varepsilon_{yyMAX}-\varepsilon_{yyMIN})$ is 2.27% or larger in Comparative Example 1, it was found that the amount of displacement can be increased more certainly when $\Delta(\varepsilon_{yyMAX}-\varepsilon_{yyMIN})$ is 2.26% or smaller. Therefore, in the range β, the amount of displacement can be increased more certainly when $\Delta(\varepsilon_{yyMAX}-\varepsilon_{yyMIN})$ satisfies the following formula (5). It was found that Example 1 satisfies the formula (5).

$$\Delta(\varepsilon_{yyMAX}-\varepsilon_{yyMIN}) \leq 2.26\% \quad (5)$$

To be noted, in Example 1, since $\varepsilon_{yyMAX}$ is a positive value, $\varepsilon_{yyMAX}$ is the maximum value of the distortion of the lattice spacing c in the extending direction. In addition, in Example 1, since $\varepsilon_{yyMIN}$ is a negative value, $\varepsilon_{yyMIN}$ is the minimum value of the distortion of the lattice spacing c in the contraction direction. In addition, in Comparative Example 1, $\varepsilon_{yyMAX}$ and $\varepsilon_{yyMIN}$ were both positive values.

As illustrated in FIG. 11, the difference in the amount of displacement after use was smaller in Example 1 than in Comparative Example 1. Therefore it was found that Example 1 has a higher reliability than Comparative Example 1.

5.2. Second Experiment

5.2.1. Sample Used for Experiment

In a second experimental example, a sample in which a Pt [111] layer (first electrode), a PbTiO$_3$ layer (orientation control layer), a PZT layer (piezoelectric layer), an SRO layer (second electrode), and a Pt layer (conductive layer) were laminated in this order was used as Example 2. The thickness of the Pt layer (first electrode) was set to 150 nm, the sum of the thickness of the PbTiO$_3$ layer and the thickness of the Pt layer was set to 2 μm, the thickness of the SRO layer was set to 40 nm, and the thickness of the Pt layer (conductive layer) was set to 100 nm.

5.2.2. Measurement of Lattice Spacing in Depth Direction of PZT Layer

Figure 12:
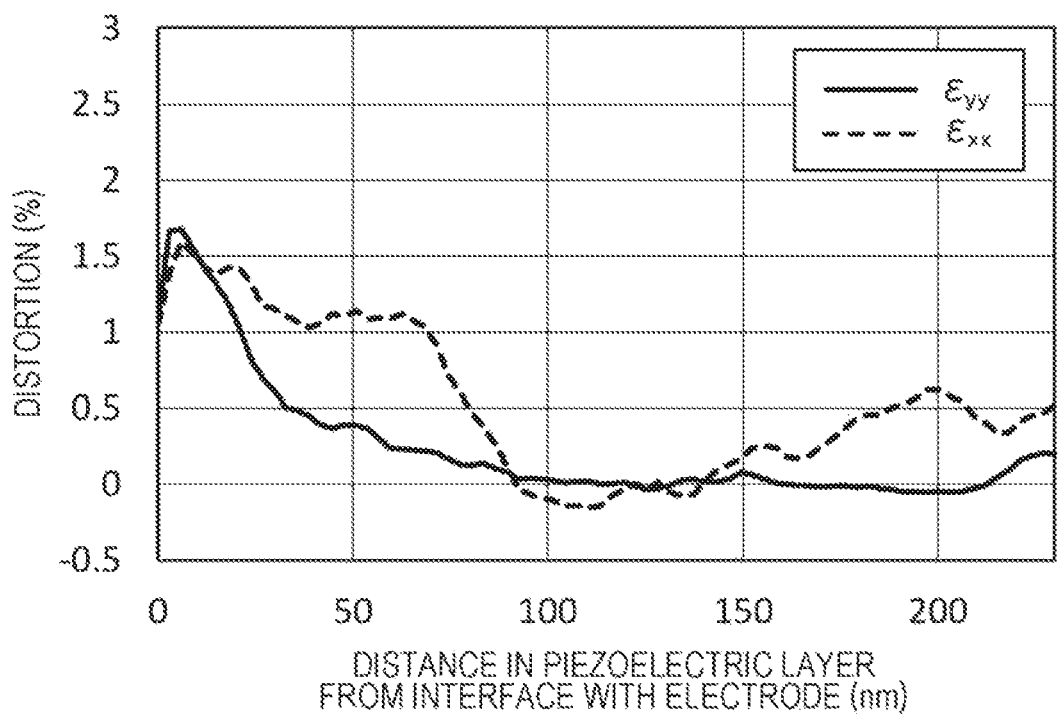
FIG. 12 is a graph illustrating a relationship between the distance in the piezoelectric layer from the interface with the electrode and distortion of lattice spacing in Example 2.
Figure 13:
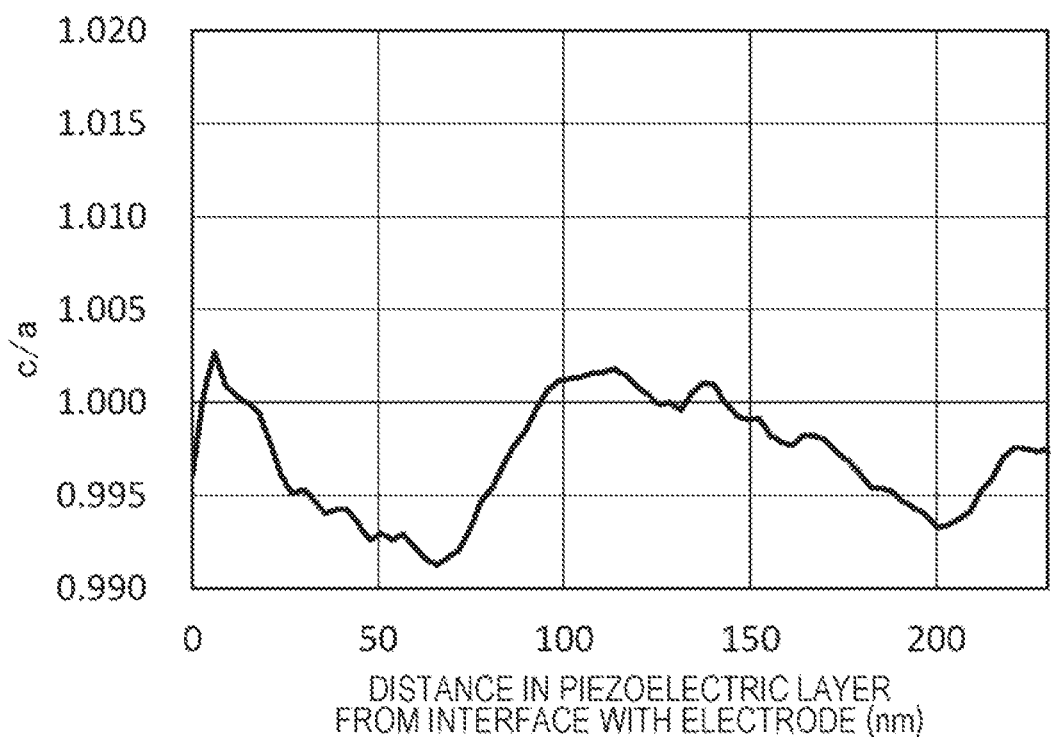
FIG. 13 is a graph illustrating a relationship between the distance in the piezoelectric layer from the interface with the electrode and a ratio c/a in Example 2.

In the second experimental example, the lattice spacing was measured in a similar manner to the first experimental example described above. FIG. 12 is a graph illustrating a relationship between depth in the piezoelectric layer and distortions $\varepsilon_{xx}$ and $\varepsilon_{yy}$ of the lattice spacings a and c in Example 2. FIG. 13 is a graph illustrating a relationship between the depth in the piezoelectric layer and the ratio c/a in Example 2.

The values of $(c/a)_{MAX}$, $\varepsilon_{yyMAX}$, and $\Delta(\varepsilon_{yyMAX}-\varepsilon_{yyMIN})$ were derived on the basis of the graphs of FIGS. 12 and 13 in a similar manner to Example 1. The results are shown below. To be noted, $(c/a)_{MAX}$ and $\varepsilon_{yyMAX}$ were recognized in the range α of 50 nm or smaller from the interface with the electrode.

$$(c/a)_{MAX}=1.003$$

$$\varepsilon_{yyMAX}=1.68\%$$

$$\Delta(\varepsilon_{yyMAX}-\varepsilon_{yyMIN})=1.73\%$$

Therefore, it was found that Example 2 satisfies the formulae (1) to (4) in the range α similarly to Example 1. Particularly, the value of $(c/a)_{MAX}$ of Example 2 is within the range of $(c/a)_{MAX}$ of Example 1. Therefore, it can be considered that, similarly to Example 1, the amount of displacement is large in Example 2 and Example 2 has a high reliability.

Elements of the invention can be partially omitted and the embodiments and modification examples may be combined as long as the features and effects described in the present disclosure are achieved.

The invention includes configurations that are substantially the same as the configuration described in the embodiment (for example, configurations having the same functions, using the same methods, and having the same results, or configurations having the same object and the same effect). In addition, the invention includes configurations in which a portion that is not significant in the configuration described in the embodiment is replaced. In addition, the invention includes configurations that have the same effect as the configuration described in the embodiment and configurations that achieve the same object. In addition, the invention includes configurations in which a known technique is added to the configuration described in the embodiment.

What is claimed is:

1. A piezoelectric element comprising:
   a piezoelectric layer having a perovskite structure including lead, zirconium, and titanium in a molar ratio, respectively, of 120:52:48; and
   an electrode provided on the piezoelectric layer,
   wherein, in the piezoelectric layer, in a range of 50 nm or smaller from an interface between the piezoelectric layer and the electrode in a thickness direction, a ratio c/a of a lattice spacing a in a direction perpendicular to the thickness direction and a lattice spacing c in the thickness direction satisfies $0.986 \leq c/a \leq 1.002$.

2. The piezoelectric element according to claim 1, wherein, in the piezoelectric layer, in a range of 230 nm or smaller from the interface between the piezoelectric layer and the electrode in the thickness direction, the ratio c/a satisfies $0.986 \leq c/a 1.008$.

3. The piezoelectric element according to claim 1, wherein, in the piezoelectric layer, in the range of 50 nm or smaller from the interface between the piezoelectric layer and the electrode in the thickness direction, distortion of the lattice spacing c in an extending direction is 2.05% or lower.

4. The piezoelectric element according to claim 1, wherein, in the piezoelectric layer, in the range of 230 nm or smaller from the interface between the piezoelectric layer and the electrode in the thickness direction, difference between a maximum value of distortion of the lattice spacing c in an extending direction and a minimum value of distortion of the lattice spacing c in a contraction direction is 2.26% or smaller.

5. The piezoelectric element according to claim 1, wherein the electrode includes an iridium oxide layer provided on the piezoelectric layer and a titanium oxide layer on the iridium oxide layer.

6. The piezoelectric element according to claim 1, wherein the electrode includes a strontium ruthenate layer provided on the piezoelectric layer and a platinum layer on the strontium ruthenate layer.

7. A liquid ejecting head comprising the piezoelectric element according to claim 1.

8. A liquid ejecting head comprising the piezoelectric element according to claim 2.

9. A liquid ejecting head comprising the piezoelectric element according to claim 3.

10. A liquid ejecting head comprising the piezoelectric element according to claim 4.

11. A liquid ejecting head comprising the piezoelectric element according to claim 5.

12. A liquid ejecting head comprising the piezoelectric element according to claim 6.

* * * * *